(12) United States Patent
Chen

(10) Patent No.: US 8,143,881 B2
(45) Date of Patent: Mar. 27, 2012

(54) CURRENT MEASURING APPARATUS FOR POWER SUPPLY

(75) Inventor: Kuo-Rong Chen, Taipei-Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 268 days.

(21) Appl. No.: 12/689,187

(22) Filed: Jan. 18, 2010

(65) Prior Publication Data

US 2011/0175596 A1    Jul. 21, 2011

(30) Foreign Application Priority Data

Jan. 15, 2010   (TW) .................................. 99101036

(51) Int. Cl.
*G01R 1/30*    (2006.01)

(52) U.S. Cl. ..................... 324/123 R; 323/220; 323/234; 330/2

(58) Field of Classification Search ............... 324/123 R, 324/123 C, 764.01; 323/220, 234; 327/51, 327/52, 54; 330/2
See application file for complete search history.

*Primary Examiner* — Arleen M Vazquez
(74) *Attorney, Agent, or Firm* — Altis Law Group, Inc.

(57) ABSTRACT

A current measuring apparatus includes a shunt circuit, a current detecting circuit, and a signal amplifying circuit. The current measuring apparatus applies the shunt circuit to receive a current to be measured. The current measuring apparatus applies the current detecting circuit to measure the voltage between two terminals of the shunt circuit. The current measuring apparatus applies the signal amplifying circuit to amplify the measured voltage. The measured current can be calculated according an expression determined by the current detecting circuit and the signal amplifying circuit.

4 Claims, 2 Drawing Sheets

CURRENT MEASURING APPARATUS FOR POWER SUPPLY

BACKGROUND

1. Technical Field

The present disclosure relates to measuring apparatuses and, particularly, to a current measuring apparatus for a power supply.

2. Description of Related Art

When a system is being tested, an output current of a power supply of the system needs to be measured. An ordinary method to measure the output current of the power supply is to use a current probe to measure the current directly, and then the current value is displayed on an oscillograph. Such a manual process of measuring current with probes is very inconvenient.

DETAILED DESCRIPTION

Figure 1:
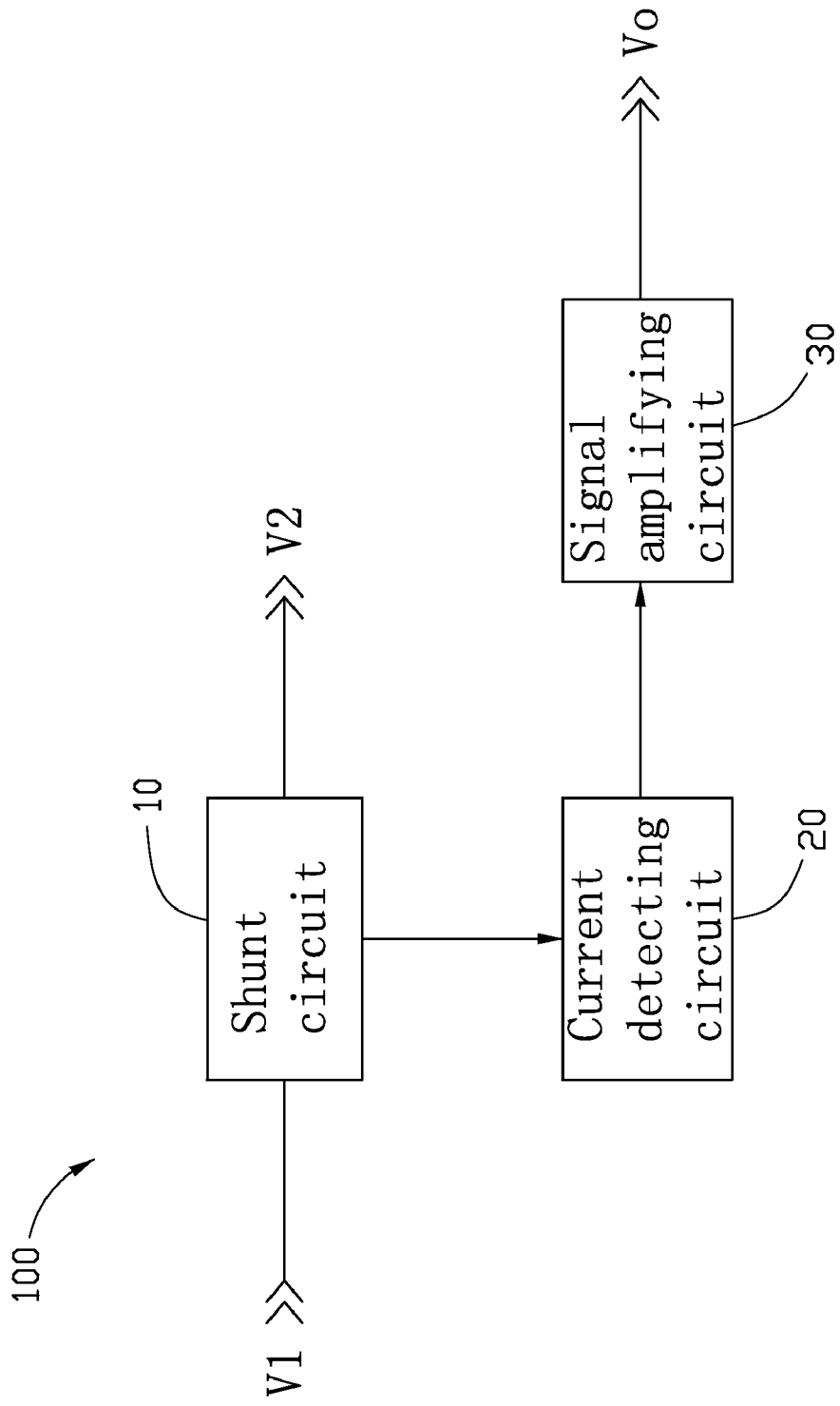
FIG. 1 is a block diagram of an exemplary embodiment of a current measuring apparatus.
Figure 2:
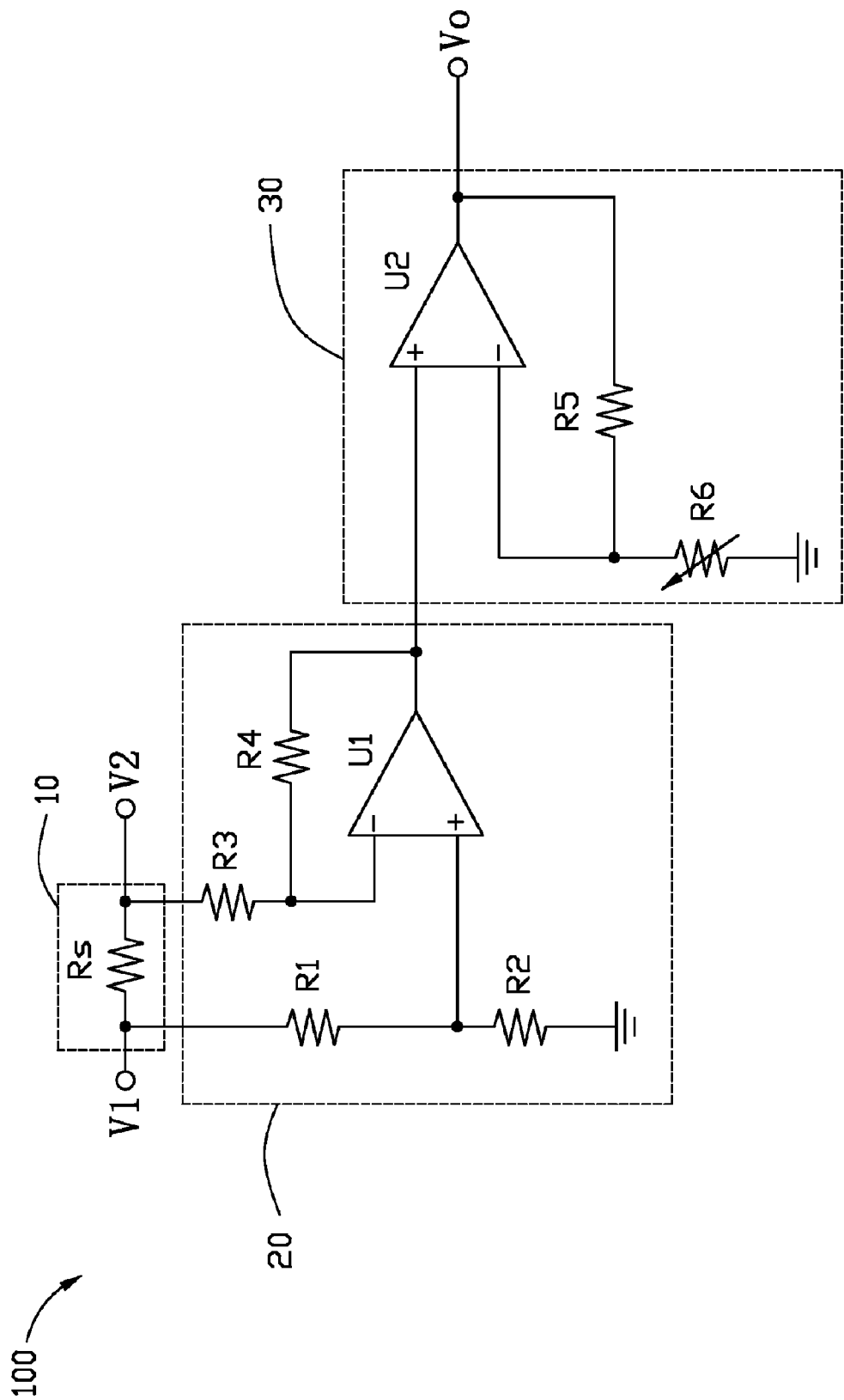
FIG. 2 is a circuit diagram of the current measuring apparatus of FIG. 1.

Referring to FIGS. 1 and 2, an exemplary embodiment of a current measuring apparatus 100 includes a shunt circuit 10, a current detecting circuit 20, a signal amplifying circuit 30, a voltage input terminal V1, and a voltage output terminal V2. The voltage input terminal V1 is used to receive an output voltage of a power supply (not shown). The voltage output terminal V2 is used to supply the output voltage to an electronic device (not shown). The shunt circuit 10 is connected between the voltage input terminal V1 and the voltage output terminal V2.

The shunt circuit 10 includes a shunt resistor Rs. In one embodiment, the shunt resistor Rs is a MANGANIN resistor. A first terminal of the shunt resistor Rs is connected to the voltage input terminal V1, a second terminal of the shunt resistor Rs is connected to the voltage output terminal V2. In other embodiments, the shunt resistor Rs can be selected from other kinds of shunt resistors.

The current detecting circuit 20 includes an operational amplifier U1 and four resistors R1-R4. The signal amplifying circuit 30 includes an amplifier U2, two resistors R5 and R6. In one embodiment, the resistor R6 may be a variable resistor R6. A first terminal of the resistor R1 is connected to the voltage input terminal V1, and a second terminal of the resistor R1 is grounded via the resistor R2. A node between the first resistor R1 and the second resistor R2 is connected to a non-inverting terminal of the operational amplifier U1. An inverting terminal of the operational amplifier U1 is connected to the voltage output terminal V2 via the resistor R3, and connected to an output terminal of the operational amplifier U1 via the resistor R4. The output terminal of the operational amplifier U1 is connected to a non-inverting terminal of the amplifier U2. An inverting terminal of the amplifier U2 is connected to an output terminal of the amplifier U2 via the resistor R5, and grounded via the resistor R6. The output terminal of the amplifier U2 is a signal collecting terminal Vo.

Wherein, a voltage at the non-inverting terminal of the operational amplifier U1 is V+, a voltage at the inverting terminal of the operational amplifier U1 is V−, a voltage at the output terminal of the operational amplifier U1 is Vd. A current through the shunt resistor Rs is I, a voltage across the shunt resistor Rs is Vin, a voltage at the voltage input terminal V1 is Vs, a voltage at the signal collecting terminal Vo is $V_{Vo}$. The following expressions are achieved.

$$V+=Vs*R2/(R1+R2);$$

$$V-=[(Vs-Vin)-Vd]*R4/(R3+R4)+Vd;$$

Since V+=V−, $$Vs*R2/(R1+R2)=[(Vs-Vin)-Vd]*R4/(R3+R4)+Vd;$$

Assume R1=R3 and R2=R4, $$Vd=Vin*R4/R3=Rs*I*R4/R3;$$

and $$Vd=V_{Vo}*R6/(R5+R6);$$

$$V_{Vo}=(1+R5/R6)*Vd;$$

Therefore, $$V_{Vo}=(1+R5/R6)*Rs*I*R4/R3.$$

Because the resistances of the resistors R1-R6 are predetermined, namely the voltage $V_{Vo}$ is directly proportional to the measured current I, the current I through the shunt resistor Rs can be calculated via the above last expression in response to the voltage Vo at the signal collecting terminal Vo being achieved. If the resistor R6 is a variable resistor, the proportion constant (1+R5/R6)*Rs*R4/R3 can be adjusted easily according to requirements.

In use, the current measuring apparatus 100 is integrated in a printed circuit board (PCB), and then the PCB is arranged in the power supply. The shunt resistor Rs is connected to a voltage output cable of the power supply. A voltage measuring apparatus, such as a thermal recorder, is connected to the signal collecting terminal Vo, to receive the voltage $V_{Vo}$. The voltage $V_{Vo}$ is transmitted to a calculating unit, such as a computer, to calculate the current I through the shunt resistor Rs, according to the last expression above, which is very convenient.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A current measuring apparatus comprising:
a shunt resistor to receive current to be measured;
an operational amplifier comprising a non-inverting terminal, an inverting terminal, and an output terminal, wherein a first terminal of the shunt resistor is grounded via a first resistor and a second resistor in series, a node between the first and second resistors is connected to the non-inverter terminal of the operational amplifier, a second terminal of the shunt resistor is connected to the inverting terminal of the operational amplifier via a third resistor, the inverting terminal of the operational amplifier is connected to the output terminal of the operational amplifier via a fourth resistor; and
an amplifier comprising a non-inverting terminal, an inverting terminal, and an output terminal to output a voltage to be measured, wherein the output terminal of the operational amplifier is also connected to the non-inverting terminal of the amplifier, the inverting terminal of the amplifier is connected to the output terminal of the amplifier via a fifth resistor, the inverting terminal of the amplifier is also grounded via a sixth resistor, the measured voltage is directly proportional with the measured current.

2. The current measuring apparatus of claim 1, wherein the shunt resistor is a MANGANIN resistor.

3. The current measuring apparatus of claim 1, wherein a resistance of the first resistor is equal to a resistance of the third resistor, a resistance of the second resistor is equal to a resistance of the fourth resistor.

4. The current measuring apparatus of claim 1, wherein the sixth resistor is a variable resistor.

* * * * *